(12) United States Patent
Mehr

(10) Patent No.: US 6,545,534 B1
(45) Date of Patent: Apr. 8, 2003

(54) LOW VOLTAGE VARIABLE GAIN AMPLIFIER WITH CONSTANT INPUT IMPEDANCE AND ADJUSTABLE ONE-POLE FILTERING CHARACTERISTIC

(75) Inventor: Iuri Mehr, North Andover, MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 09/782,242

(22) Filed: Feb. 13, 2001

(51) Int. Cl.⁷ .............................. H03F 3/45; H03F 3/20
(52) U.S. Cl. .................... 330/69; 330/254; 330/284
(58) Field of Search ............................. 330/9, 69, 109, 330/144, 254, 284, 294

(56) References Cited

U.S. PATENT DOCUMENTS

| | | | | |
|---|---|---|---|---|
| 4,072,906 A | | 2/1978 | Schröder | 330/86 |
| 5,285,169 A | | 2/1994 | Theus | 330/254 |
| 5,387,879 A | | 2/1995 | Satoh | 330/282 |
| 5,523,712 A | | 6/1996 | Miyabe et al. | 327/355 |
| 5,973,536 A | * | 10/1999 | Maejima | 330/9 X |
| 6,127,893 A | * | 10/2000 | Llewellyn et al. | 330/284 |

* cited by examiner

*Primary Examiner*—Steven J. Mottola
(74) *Attorney, Agent, or Firm*—Samuels, Gauthier & Stevens, LLP

(57) ABSTRACT

A differential variable gain amplifier (VGA) with constant input impedance and an adjustable one-pole filtering characteristic is provided. Each input of the VGA has a set of parallel resistors connected thereto. Except for one resistor in each set, each of the resistors of the two sets is connected to its corresponding summing junction (op-amp input), or to a corresponding resistor of the other set via a switch. Switching the resistors to their corresponding summing junction or to the corresponding resistor of the other set provides for the variable gain function, where the gain is proportional to the number of resistors connected to the summing junction. The configuration of resistors provides a constant input impedance to the VGA of $R/(n+1)$, where R is the resistance value of the resistors. In addition to the input resistor networks, the VGA comprises a fixed feedback resistance, along with a parallel capacitor array in the feedback paths of the differential op-amp to provide one-pole filtering of the input signal. To maintain the filtering characteristics constant for a change in the gain, the op-amp comprises an internal compensation network for adjusting the open-loop bandwidth of the op-amp.

19 Claims, 3 Drawing Sheets

LOW VOLTAGE VARIABLE GAIN AMPLIFIER WITH CONSTANT INPUT IMPEDANCE AND ADJUSTABLE ONE-POLE FILTERING CHARACTERISTIC

BACKGROUND OF THE INVENTION

The invention relates to the field of variable gain amplifiers, and in particular to variable gain amplifiers with constant input impedance and adjustable one-pole filtering characteristics.

Variable gain amplifiers (VGA) are known in the art and are utilized in a number of applications. Traditionally, a VGA comprises an operational amplifier (op-amp) having adjustable resistances in either the feedback path (from op-amp output to op-amp input), the signal input path, or both. By adjusting the resistance in either of these paths, the feedback factor of the amplifier is adjusted, thereby providing the variable gain.

One disadvantage of the traditional implementation of a VGA is that, as the gain of the VGA is adjusted by changing the feedback factor, the closed-loop bandwidth of the VGA changes. This is due to the fact that the closed-loop bandwidth of the VGA is approximately the open-loop bandwidth, which is fixed, of the op-amp (op-amp transfer function) multiplied by the feedback factor. As the gain increases, the feedback factor decreases and, therefore, the closed-loop bandwidth decreases. Therefore, for higher gains, the bandwidth of the VGA is more limited, limiting the range of input signals applied to the VGA.

U.S. Pat. No. 5,285,169, entitled *Monolithic Integrated Differential Amplifier with Digital Gain Setting*, seeks to correct this disadvantage by providing an operational amplifier in which the gain-bandwidth product (open-loop bandwidth) of the op-amp is adjustable. The gain-bandwidth product is made adjustable by adjusting the channel width Wt and source current "it" of transistors t1 and t2 in the differential stage "tv" of the op-amp. These variables are adjusted by activating a parallel stage "to", comprising transistors t7 and t16.

While the '169 patent addresses the drawback of a fixed gain-bandwidth product, there are a number of disadvantages to the VGA of the '169 patent, as well as the traditional VGA. The adjustment of the resistance in the input path causes the input impedance to change. Particularly when a VGA is utilized to implement an analog front-end system, this creates difficulties in matching the driver of the input to the input impedance.

In addition, at times it is desirable provide a one-pole filtering characteristic with the VGA. Often this is done to reduce noise in the input signal. This is typically accomplished by providing capacitance in the feedback path of the op-amp. However, when traditional VGAs that adjust the resistance in the feedback path to adjust the gain are utilized in conjunction therewith, the time constant, and implicitly, the pole location of the VGA is changed as the gain is changed.

Therefore, what is needed is a variable gain amplifier which has constant input impedance and one-pole filtering characteristics which are adjustable so as to remain constant for a change in gain.

SUMMARY OF THE INVENTION

The present invention provides for a variable gain amplifier with constant input impedance and an adjustable one-pole filtering characteristic. Preferably, a first set of n+1 parallel resistors is connected to input $V_{in}$ and a second set of n+1 parallel resistors is connected to input $V_{ip}$. Except for one resistor in each set, each of the resistors of the two sets is connected to its corresponding summing junction (op-amp input), or to a corresponding resistor of the other set via a switch. Switching the resistors to their corresponding summing junction or to the corresponding resistor of the other set provides for the variable gain function, where the gain is proportional to the number of resistors connected to the summing junction. However, regardless of the number of resistors switched to the summing junctions, the input impedance of the VGA remains a constant impedance of $R/(n+1)$, where R is the resistance value of the resistors. In addition to the input resistor networks, the VGA of the present invention comprises a fixed feedback resistance, along with, preferably, a parallel capacitor array in the feedback paths of the differential op-amp to provide one-pole filtering of the input signal. Changing the value of the capacitance, by switching capacitors in the array in and out, changes the one-pole filtering characteristics without affecting the VGA gain. To maintain the filtering characteristics constant for a change in the gain, the op-amp comprises an internal compensation network for adjusting the open-loop bandwidth of the op-amp.

DETAILED DESCRIPTION OF THE INVENTION

Figure 1A:
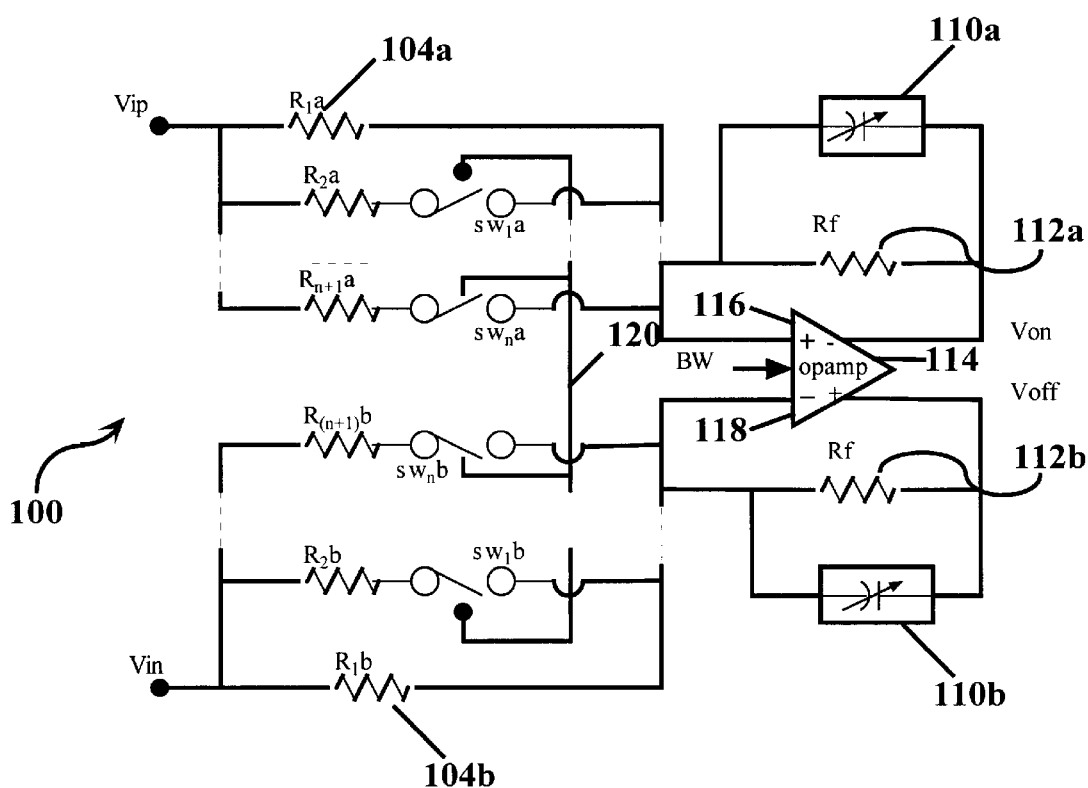
FIG. 1a illustrates a differential variable gain amplifier of the present invention.

FIG. 1a illustrates the variable gain amplifier 100 of the present invention which comprises two sets of resistor networks 104a and 104b, each with resistors having a resistance R and connected to the positive input $V_{ip}$ and negative input $V_{in}$, respectively; op-amp 114, variable capacitor arrays 110a and 110b and feedback resistors 112a and 112b, having a resistance $R_f$. Amplifier 100 is a double-input and double-output differential amplifier with outputs $V_{on}$ and $V_{op}$. Feedback resistor 112a and capacitor array 110a are connected in parallel between output $V_{on}$ and non-inverting input (summing junction) 116 of op-amp 114 (feedback path). Likewise, feedback resistor 112b and capacitor array 110b are connected in parallel in the feedback path corresponding to output $V_{op}$ and inverting input (summing junction) 118. Each set of resistors has n+1 resistors, and in each set of resistors, except for one resistor $R_1a$, $R_1b$, each of the resistors $R_2a$-$R_{(n+1)}a$ and $R_2b$-$R_{(n+1)}b$ are switched to the corresponding summing junction (which is virtual ground) or switched to the corresponding resistor connected to the other polarity input via n switches $sw_1a$-$sw_na$ and $sw_1a$-$sw_nb$.

Switching of resistors $R_1a$-$R_{(n+1)}a$ and $R_1b$-$R_{(n+1)}b$ provides for the variable gain function of VGA 100. When m resistors of each set are switched to the corresponding summing junction, the overall DC gain is $m*R_f/R$. Preferably, the gain change is made linear in decibels with 6 dB steps by making the number of resistors in a set (n+1) a power of two. Hence, for example, if n=31 and 31 resistors are switched to the summing junction, there is a gain of 32*$R_f$/R, a gain of 16*$R_f$/R for 15 resistors connected to the summing junction, and so on.

For the preferred implementation of a differential variable gain amplifier, the inputs $V_{ip}$ and $V_{in}$ are substantially equal in magnitude, but opposite in polarity. Due to this, coupled with the fact that the resistance values of the input resistors are all equal, from a differential standpoint, when a resistor is connected to the corresponding resistor in the other set, node 120 between the resistors is a virtual ground. Therefore, as the summing junctions (inputs) are also virtual ground, no matter whether the resistors are switched to a summing junction, or to a corresponding resistor, the input impedance to VGA 100 for either input $V_{ip}$ or $V_{in}$ is constant with a value of R/n+1. This allows for matching the driver of the input to the input impedance of VGA 100.

Figure 1B:
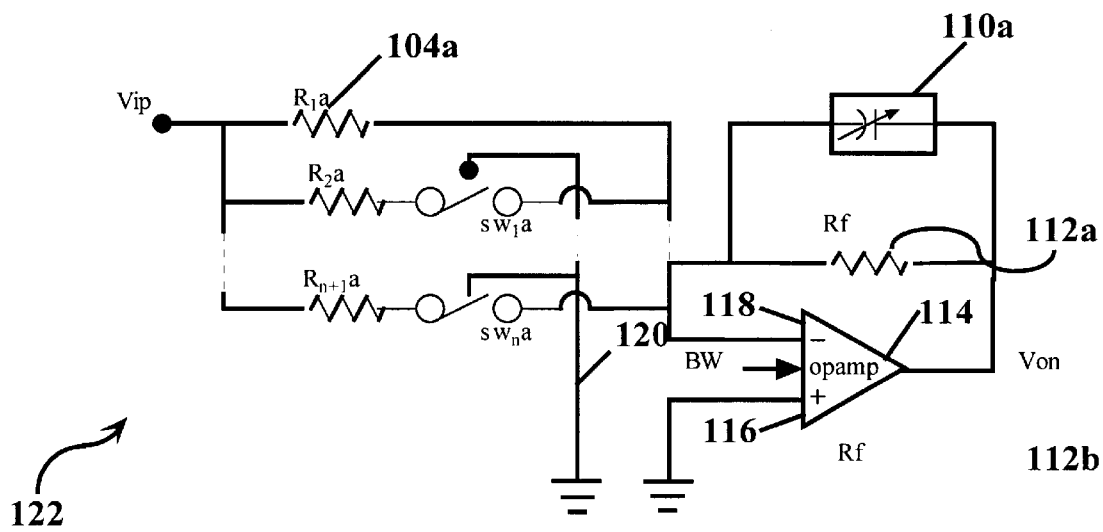
FIG. 1b illustrates a single-ended variable gain amplifier of the present invention.

Another embodiment of the present invention is a single-ended configuration of the VGA 100. This embodiment is illustrated in FIG. 1b, where like numerals represent like elements of FIG. 1a. Single-ended VGA operates similar to differential VGA 100, however, for single-ended VGA 122, instead of being a virtual ground, node 120 is connected to ground along with non-inverting input 116 of op-amp 114. In addition, the feedback is provided between the op-amp output and the inverting input, so as to provide negative feedback.

For either a differential or single-ended VGA, in the preferred embodiment of the present invention, one-pole filtering characteristics are provided by VGA 100 in order to reduce noise in the input. This is accomplished by variable capacitor arrays 110a and 110b in the feedback paths of op-amp 114. While the one-pole filtering characteristics are able to be provided by a single capacitor in the feedback path, it is preferable to utilize a capacitor array so that the filtering characteristics can be adjusted by switching capacitors into and out of the feedback path, rather than feedback resistors. This provides distinct advantages for certain uses of VGA 100. For instance, when VGA 100 is fabricated monolithically, often times the fabricated component values are not precise and, by adjusting the total capacitance in the feedback array, the filtering characteristics can be adjusted to the nominal design characteristics. In addition, it may be desirable to continually compensate for variations in the component values during operation of VGA due to variations in temperature or supply voltage, so as to maintain the filter characteristics near the nominal design value.

The one-pole transfer function of VGA 100 is determined by the time constant $R_f C_a$ (where $C_a$ is the total capacitance in the feedback path). By providing a fixed feedback resistance $R_f$ in the feedback paths, the time constant, and implicitly, the pole location is adjustable independently from the switching of the resistors to effect a gain change of VGA 100.

However, a change in the gain affects the closed-loop bandwidth, as the closed-loop bandwidth is approximately the product of the open-loop bandwidth and the feedback factor. Therefore, in order to maintain the closed-loop bandwidth constant, the open-loop bandwidth needs to be adjusted when there is a change in the gain.

Figure 2:
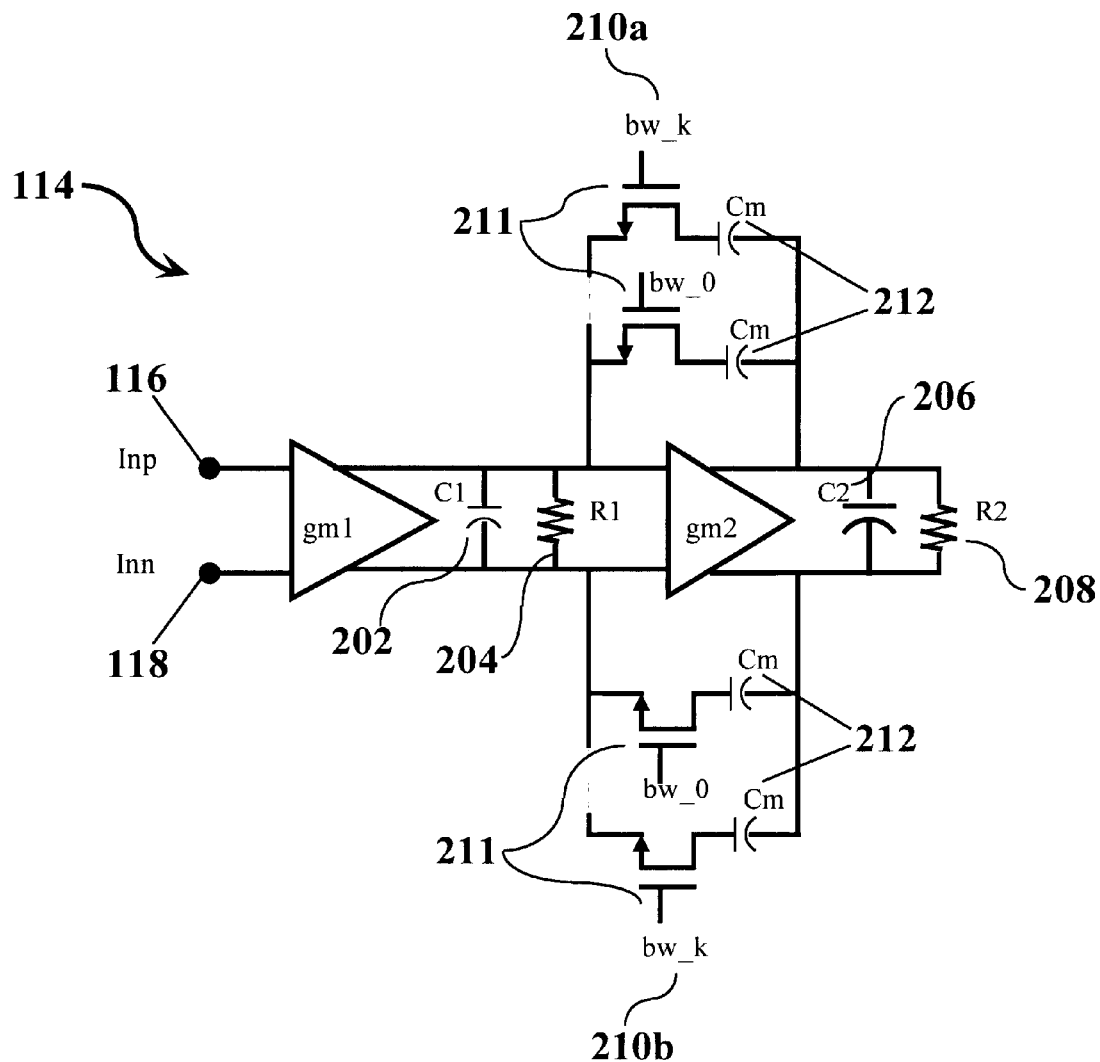
FIG. 2 illustrates a small signal model of the operational amplifier of the present invention including a compensation network.

In order to adjust the open-loop bandwidth of op-amp 114, a preferred embodiment of the present invention comprises a compensation network internal to op-amp 114. FIG. 2 illustrates a small-signal model of op-amp 114, including compensation networks 210a and 210b. Compensation network 210a adjusts the open-loop bandwidth for the non-inverting input 116 and 210b adjusts for the inverting input 118. Preferably, VGA 100 is utilized in low voltage supply applications, therefore, the op-amp is assumed to be a two-stage topology. For low voltage supply applications, a two-stage topology is preferred, as a single stage topology normally does not provide enough gain with restricted headroom due to a low power supply. However, the present invention should not be seen as limited to a two-stage topology.

As illustrated, op-amp 114 includes two equal sets of k parallel capacitor-resistor branches around second stage gm2. Each branch has a capacitor 212, with capacitance Cm, in series with a resistor 211. As illustrated, resistor 211 is preferably a triode-mode Metal Oxide Semiconductor (MOS) device having a corresponding gate. The open-loop bandwidth of op-amp 114 is incrementally changed by switching a MOS device in a branch on or off. Therefore, the overall adjustment to the open-loop bandwidth is performed by switching a number of the MOS devices on or off, depending upon the overall adjustment needed, by applying the power supply voltage to the appropriate gates (switch on) or by applying ground to the appropriate gates (switch off), i.e. the signals bw0-bwk are either ground or power supply. If the gates of n MOS devices 211 are tied to the power supply (i.e. switched on), then the open-loop bandwidth of the amplifier 114 is approximately gm1/(k$C_m$), where gm1 is the transconductance of the first stage. Therefore, by adjusting the total number of MOS devices turned on, the open-loop bandwidth is adjusted and the change in the closed-loop bandwidth due to the change in the gain is compensated for. For example, as the closed-loop bandwidth (which is approximately the open-loop bandwidth multiplied by the feedback factor) decreases with the gain of the VGA increasing (because the feedback factor is decreasing), the open-loop bandwidth is increased by turning off MOS devices.

While not a part of the present invention, it should be understood that, typically, a control circuit outputs digital signals to appropriately set the various parameters of VGA 100. For instance, the control circuit outputs a digital word of n bits, each of which are applied to a switch of the resistor networks 104a and 104b to adjust the gain of VGA 100. Preferably, at the same time, the control circuit outputs a digital word of k signals which is input to op-amp 114 (as illustrated by signal BW in FIG. 1a) where each of the k signals are applied to a gate of a MOS device in the compensation network. Also, the control circuit outputs a digital word which controls the number of capacitors switched into the capacitor arrays 110a and 110b so as to set the filter characteristics of VGA 100.

Although the present invention has been shown and described with respect to several preferred embodiments thereof, various changes, omissions and additions to the form and detail thereof, may be made therein, without departing from the spirit and scope of the invention.

What is claimed is:

1. A differential variable gain amplifier having constant input impedance, said variable gain amplifier comprising:

an op-amp, said op-amp having a first feedback resistor connected between an inverting output and a non-inverting input, said op-amp having a second feedback resistor connected between a non-inverting output and an inverting input;

a first set of two or more parallel resistors, each of said parallel resistors having one terminal connected to a first variable gain amplifier input node, at least one of said resistors having a second terminal connected to said op-amp non-inverting input, a remainder of said resistors of said first set having a second terminal selectively connected between said non-inverting input and a circuit node via a switch, and a second set of two or more parallel resistors, each of said parallel resistors having one terminal connected to a second variable gain amplifier input node, at least one of said resistors having a second terminal connected to said op-amp inverting input, a remainder of said resistors of said second set having a second terminal selectively connected between said inverting input and said circuit node via a switch.

2. The amplifier as per claim 1, said amplifier further comprising:

a first variable capacitor array connected between said inverting op-amp output and said op-amp non-inverting input, and a second variable capacitor array connected between said non-inverting op-amp output and said op-amp inverting input.

3. The amplifier as per claim 2, wherein filter characteristics of said amplifier are set independently of a gain change by adjusting the total capacitance of said variable capacitor arrays.

4. The amplifier of claim 2, wherein said op-amp further comprises:

a first amplifying stage having a first input connected to said non-inverting input, a second input connected to said inverting input and first and second outputs;

a second amplifying stage having a first input connected to said first output of said first amplifying stage, a second input connected to said second output of said first amplifying stage, a first output connected to said op-amp inverting output and a second output connected to said op-amp non-inverting output;

a first set of resistor-capacitor branches, each branch having a resistance and capacitance connected in series, each resistor-capacitor branch of said first set connected in parallel between said first output of said second amplifying stage and said first input of said second amplifying stage, each branch selectively activated to add to a total capacitance or deactivated to subtract from a total capacitance so as to change an open loop bandwidth of said op-amp for said first input of said first amplifying stage, and a second set of resistor-capacitor branches, each branch having a resistance and capacitance connected in series, each resistor-capacitor branch of said second set connected in parallel between said second output of said second amplifying stage and said second input of said second amplifying stage, each branch selectively activated to add to a total capacitance or deactivated to subtract from a total capacitance so as to change an open loop bandwidth of said op-amp for said second input of said first amplifying stage.

5. The amplifier as per claim 4, wherein a number of activated branches in said first set of resistor-capacitor branches is equal to a number of activated branches in said second set of resistor-capacitor branches.

6. The amplifier as per claim 4, wherein said resistance of each branch of said sets is a MOS device having a corresponding gate, said branches are activated by providing a signal equal to a power supply signal to said gate and said branches are deactivated by providing a signal equal to ground to said gate.

7. The amplifier as per claim 1, wherein the number of parallel resistors in said first set is a power of two and the number of parallel resistors in said second set is a power of two.

8. The amplifier as per claim 1, wherein resistance values of each resistor in said first and second set are substantially equal.

9. A variable gain amplifier with constant input impedance and one pole filter characteristics, said variable gain amplifier comprising:

an op-amp comprising:
a non-inverting input;
a non-inverting output;
an inverting input;
an inverting output;
a first amplifying stage having a first input operatively connected to said non-inverting input, a second input operatively connected to said inverting input, a first output operatively connected to said non-inverting output and a second output operatively connected to said inverting output;
a first set of resistor-capacitor branches, each branch having a resistance and capacitance connected in series, each resistor-capacitor branch of said first set connected in parallel between said first output of said second amplifying stage and said first input of said second amplifying stage, each branch selectively activated to add to a total capacitance or deactivated to subtract from a total capacitance so as to change an open loop bandwidth of said op-amp for said non-inverting, and
a second set of resistor-capacitor branches, each branch having a resistance and capacitance connected in series, each resistor-capacitor branch of said second set connected in parallel between said second output of said second amplifying stage and said second input of said second amplifying stage, each branch selectively activated to add to a total capacitance or deactivated to subtract from a total capacitance so as to change an open loop bandwidth of said op-amp for said inverting input;

a first variable capacitor array connected between said op-amp non-inverting output and said op-amp non-inverting input;

a second variable capacitor array connected between said op-amp inverting output and said op-amp inverting input;

a first feedback resistor connected between said op-amp non-inverting output and said op-amp non-inverting input;

a second feedback resistor connected between said op-amp inverting output and said op-amp inverting input;

a first set of two or more parallel resistors, each of said parallel resistors having one terminal connected to a first variable gain amplifier input node, at least one of said resistors having a second terminal connected to said op-amp non-inverting input, a remainder of said resistors of said first set having a second terminal selectively connected between said non-inverting input and a circuit node via a switch, and a second set of two or more parallel resistors, each of said parallel resistors having one terminal connected to a second variable gain amplifier input node, at least one of said resistors having a second terminal connected to said op-amp inverting input, a remainder of said resistors of said second set having a second terminal selectively connected between said inverting input and said circuit node via a switch.

10. The variable gain amplifier as per claim 9, wherein said op-amp further comprises:

a second amplifying stage operatively connecting said non-inverting input to said first amplifying stage first input and operatively connecting said inverting input to said first amplifying stage second input.

11. The variable gain amplifier as per claim 9, wherein a number of activated branches in said first set of resistor-capacitor branches is equal to a number of activated branches in said second set of resistor-capacitor branches.

12. The variable gain amplifier as per claim 9, wherein said resistance of each branch of said sets is a MOS device having a corresponding gate, said branches are activated by providing a signal equal to a power supply signal to said gate and said branches are deactivated by providing a signal equal to ground to said gate.

13. The variable gain amplifier as per claim 9, wherein the number of parallel resistors in said first set is a power of two and the number of parallel resistors in said second set is a power of two.

14. The variable gain amplifier as per claim 9, wherein resistance values of each resistor in said first and said second set are substantially equal.

15. A method of adjusting the gain and filtering characteristics of an analog front-end system, said method comprising:

providing a variable gain amplifier comprising:

an op-amp having an inverting input, an inverting output, a non-inverting input, a non-inverting output and an internal compensation network, said internal compensation network adjusting an open loop bandwidth of said op-amp in response to a received digital signal;

a first feedback resistor connected between said inverting output and said inverting input and a second feedback resistor connected between said non-inverting output and said non-inverting input;

a first variable capacitor array connected between said inverting output and said inverting input and a second variable capacitor array connected between said non-inverting output and said non-inverting input;

a first set of two or more parallel resistors, each of said parallel resistors having one terminal connected to a first variable gain amplifier input node, at least one of said resistors having a second terminal connected to said op-amp non-inverting input, a remainder of said resistors of said first set having a second terminal selectively connected between said non-inverting input and a circuit node via a switch, and a second set of two or more parallel resistors, each of said parallel resistors having one terminal connected to a second variable gain amplifier input node, at least one of said resistors having a second terminal connected to said op-amp inverting input, a remainder of said resistors of said second set having a second terminal selectively connected between said inverting input and said circuit node via a switch;

setting a total capacitance of said first and second variable capacitor arrays to provide predetermined filter characteristics by providing a digital signal to said;

adjusting a gain of said variable gain amplifier by providing a digital signal to said first and second sets of resistors causing a predetermined number of said remainder of resistors to be switched to said op-amp inputs, and adjusting filter characteristics of said variable gain amplifier to said predetermined filter characteristics upon said adjustment of said gain by providing a digital signal to said op-amp to adjust said open loop bandwidth via said op-amp internal compensation network.

16. A differential variable gain amplifier having constant input impedance, said variable gain amplifier comprising:

an op-amp, said op-amp having a first feedback resistor connected between a first output and a non-inverting input, said op-amp having a second feedback resistor connected between a second output and an inverting input;

a first set of n+1 parallel resistors having resistance R, each of said parallel resistors having one terminal connected to a first variable gain amplifier input node, one of said resistors having a second terminal connected to said op-amp non-inverting input, n resistors of said first set having a second terminal selectively connected between said non-inverting input and a circuit node via a switch;

a second set of n+1 parallel resistors having resistance R, each of said parallel resistors having one terminal connected to a second variable gain amplifier input node, one of said resistors having a second terminal connected to said op-amp inverting input, n resistors of said first set having a second terminal selectively connected between said inverting input and said circuit node via a switch, and wherein said first and said second sets of resistors provide a constant input impedance equal to $R/(n+1)$ for said first and said second variable gain amplifier input nodes.

17. A differential variable gain amplifier having constant input impedance, said variable gain amplifier comprising:

an op-amp, said op-amp having at least one feedback resistor connected between an output of said op-amp and an inverting input, said op-amp having a non-inverting input connected to ground, a variable capacitor array connected between said op-amp output and said op-amp inverting input, and a second set of two or more parallel resistors, each of said parallel resistors having one terminal connected to a variable gain amplifier input node, at least one of said resistors having a second terminal connected to said op-amp inverting input, a remainder of said resistors of said second set having a second terminal selectively connected between said inverting input and ground.

18. The amplifier as per claim 17, wherein filter characteristics of said amplifier are set independently of a gain change by adjusting the total capacitance of said variable capacitor arrays.

19. The amplifier of claim 17, wherein said op-amp further comprises:

a first amplifying stage having a first input connected to said inverting input, a second input connected to said non-inverting input and first and second outputs;

a second amplifying stage having a first input connected to said first output of said first amplifying stage, a second input connected to said second output of said first amplifying stage, and an output connected to said op-amp output, and a set of resistor-capacitor branches, each branch having a resistance and capacitance connected in series, each resistor-capacitor branch of said first set connected in parallel between said output of said second amplifying stage and said first input of said second amplifying stage, each branch selectively activated to add to a total capacitance or deactivated to subtract from a total capacitance so as to change an open loop bandwidth of said op-amp for said first input of said first amplifying stage.

* * * * *